United States Patent
Winter

(10) Patent No.: US 7,796,058 B2
(45) Date of Patent: Sep. 14, 2010

(54) METHOD AND APPARATUS FOR DATA TRANSFORM

(75) Inventor: Howard W. Winter, Southampton (GB)

(73) Assignee: Xyratex Technology Limited, Havant (GB)

( * ) Notice: Subject to any disclaimer, the term of this patent is extended or adjusted under 35 U.S.C. 154(b) by 406 days.

(21) Appl. No.: 12/021,785

(22) Filed: Jan. 29, 2008

(65) Prior Publication Data

US 2009/0193213 A1 Jul. 30, 2009

Related U.S. Application Data

(60) Provisional application No. 60/889,394, filed on Feb. 12, 2007.

(51) Int. Cl.
*H03M 5/00* (2006.01)

(52) U.S. Cl. .......................... 341/55; 382/216; 382/209

(58) Field of Classification Search .............. 341/50–80; 382/103, 209, 141, 228, 216, 274
See application file for complete search history.

(56) References Cited

U.S. PATENT DOCUMENTS

| | | | |
|---|---|---|---|
| 6,199,064 B1 | 3/2001 | Schindler | |
| 6,895,421 B1 * | 5/2005 | Dor et al. | 708/400 |
| 6,993,156 B1 * | 1/2006 | Szeliski et al. | 382/103 |
| 7,302,084 B2 * | 11/2007 | Szeliski et al. | 382/103 |
| 7,574,017 B2 * | 8/2009 | Szeliski et al. | 382/103 |

FOREIGN PATENT DOCUMENTS

WO 2004/038923 5/2004

OTHER PUBLICATIONS

Burrows et al., "A Block-sorting Lossless Data Compression Algorithm", SRC Research Report 124, Digital System Research Center, 1994.
Mukherjee et al., "Prototyping of Efficient Hardware Algorithms for Data Compression in Future Communication Systems", Proceedings of the 12$^{th}$ International Workshop on Rapid System Prototyping, , IEEE, 2001, pp. 58-63.

(Continued)

*Primary Examiner*—Lam T Mai
(74) *Attorney, Agent, or Firm*—Pillsbury Winthrop Shaw Pittman LLP

(57) ABSTRACT

In an apparatus and method of transforming a block of data elements, the order of the data elements is transformed. The data elements are stored in an initial order in respective ones of first and second memory elements, each first memory element corresponding to a respective second memory element. The contents of all respective pairs of the first and second memory elements are compared. The data elements in the second memory elements are shifted to different ones of the second memory elements after each comparison while maintaining the initial order of the data elements. The shifts and comparisons are repeated until every data element has been compared with every other data element. The results of the comparisons are combined after each comparison to provide a result that can be used to order the data elements to a final order.

43 Claims, 15 Drawing Sheets

OTHER PUBLICATIONS

Martinez et al., An FPGA-based Parallel Sorting Architecture for the Burrows Wheeler Transform: Proceedings of the 2005 International Conference on Reconfigurable Computing and FPGAs,ReConFig 2005, IEEE, 7 pages.

Baron et al., "Antisequential Suffix Sorting for BWT-Based Data Compression", IEEE Transactions on Computers, vol. 54, No. 4, Apr. 2005, pp. 1-12.

The Burrow-Wheeler Transform: Ten Years Later, Proceedings DIMACS, Aug. 19-20, 2004, pp. 1-40.

Deorowicz, "Second step algorithms in the Burrows-Wheeler compression algorithm", Software-Practice Experience, 2002, vol. 32, No. 2, Nov. 22, 2001, pp. 99-111.

Gilchrist, "Parallel Data Compression with BZIP2", Elytra Enterprises Inc. , 6 pages.

Gilchrist, "Parallel Data Compression with BZIP2", Elytra Enterprises Inc. , Nov. 9, 2004, 6 pages.

\* cited by examiner

Stage 1, x=1

Stage 2, x=2

METHOD AND APPARATUS FOR DATA TRANSFORM

This application claims the benefit of priority to U.S. application Ser. No. 60/889,394, filed Feb. 12, 2007, the content of which is hereby incorporated by reference.

The present invention relates to a method and apparatus for data transform, i.e. for transforming a block of data elements so that the order of the data elements is transformed (e.g. from an initial order to, a final order or from a final order to an initial order).

In this specification, Boolean notation is used such that the symbol "+" is used to indicate a logical "OR" (which in modulo 2 is equivalent to addition) and the symbol "·" is used to indicate a logical "AND".

Data compression can be regarded as encoding data in fewer bits or bytes than it would otherwise take. This is achieved typically by exploiting statistical redundancy within the data, such as symbol frequencies, repeated strings, common shapes or even events in time. Data compression is a wide subject area with many aspects. However, broadly speaking, data compression falls into one of two types, namely lossy compression and lossless compression.

Lossy compression achieves data reduction as a one-way process such that decompression does not and cannot return the data to its original form. Lossy data compression is typically used in audio and video applications, for example the MP3 audio and MPEG video standards.

Lossless data compression does allow the compression process to be reversed so is often used as a general purpose method of compressing any data. A popular lossless compression format is the ZIP file format.

Typically, lossy data compression achieves higher compression ratios than lossless data compression as it can discard information typically at the expense of some quality metric which is specific to the type of data being compressed. Lossless data compression can sometimes cause data expansion, for example if the data is too random.

The Burrows-Wheeler transform (hereafter often abbreviated to "BWT") is an algorithm that rearranges the order of characters (or other symbols, the term "character" being construed broadly) within a string of characters. None of the characters in the string changes value. The BWT is used in compression algorithms, such asbzip2, to rearrange the order of a string of characters prior to compression of the string. The re-ordering of the string by the BWT tends to result in a string in which a single character is repeated several times and in which common characters appear closer to each other. Compressing a string that has runs of repeated characters is more efficient in terms of the resultant compression ratio. Pre-processing data with the BWT is typically coupled with compression techniques such as move-to-front transform and run-length encoding. The BWT was first disclosed in a paper by M. Burrows and D. J. Wheeler published as SRC Research Report 124 and entitled "A Block-sorting Lossless. Data Compression Algorithm", DIGITAL System Research Center, 1994.

The transform is done by first taking all rotations of the input string, which can be done by effectively listing all cyclic shifts by one character of the input string. For example, where the input string is the text. "BAD BANANA.", this is first successively rotated one character at a time to yield the following matrix in which each successive row contains the same string of characters in the same order but shifted by one character to the right:

TABLE 1

Input → 
```
BAD BANANA.
AD BANANA. B
D BANANA. BA
 BANANA. BAD
BANANA. BAD 
ANANA. BAD B
NANA. BAD BA
ANA. BAD BAN
NA. BAD BANA
A. BAD BANAN
. BAD BANANA
```

Then, the rotations of the text are sorted lexicographically to yield the sorted matrix:

TABLE 2

Input →
```
BAD BANANA.     BANANA. BAD
AD BANANA. B    .BAD BANANA
D BANANA. BA    A. BAD BANAN
 BANANA. BAD    AD BANANA. B
BANANA. BAD     ANA. BAD BAN
ANANA. BAD B    ANANA. BAD B
NANA. BAD BA    BAD BANANA.    ← Ref Pos
ANA. BAD BAN    BANANA. BAD
NA. BAD BANA    D BANANA. BA
A. BAD BANAN    NA. BAD BANA
.BAD BANANA     NANA. BAD BA
```
↑ Output The output string of the BWT is the characters of the last column in the sorted matrix. Thus, in this example, the text "BAD BANANA." is transformed into "DANBNB AAA" through these steps.

One particularly valuable feature of the BWT is that it is reversible, allowing the original string of characters to be re-generated from the last column data. This makes the BWT particularly useful in lossless compression. For this purpose, the position of the original string (here the text "BAD BANANA." in the sorted matrix is noted and stored (here, the seventh row indicated by "Ref Pos" in Table 2 above) to be used in combination with the output string which, as mentioned, is obtained as the last column of characters in the sorted matrix. In the original paper by Burrows and Wheeler, to unsort this last column, a so-called transformation vector is constructed. The transformation vector is an array that has one index for each row and that effectively defines the order in which the rotated strings are scattered throughout the rows of the sorted matrix. For a given row i, T[i] is defined as the row in the sorted matrix where the string S[i+1] of the unsorted matrix is found. The transformation vector effectively allows the inverse Burrow Wheeler transform (IBWT) to be carried out by "walking" back through the sorted rows.

A number of optimisations are typically used to make implementation of this algorithm practical. For example, in the transform, there is no need to store the table or matrix. It is common for software implementations to represent each row of the table by a number of pointers into the strings. In inverse. BWT there is no need to store the table or to do the multiple sorts. It is sufficient to sort the transformed string once with a stable (i.e. order preserving) sort, and remember where each character moved. Starting at the character corresponding to the "Ref Pos", a cyclic permutation can then be performed by "walking" back up the sorted transformed string, the output of this being the original string.

It should be noted that a "character" in the algorithm can be a byte, or a bit, or any other convenient size.

It has been found that compression algorithms using the BWT can achieve high levels of compression and, for example, typically outperform those using Lempel-Ziv (LZ) based algorithms. However, most implementations of BWT are software implementations. As is well known, a software-implemented algorithm is typically slow compared to a direct logic implementation, i.e. one implemented directly in hardware. All known, commercially available, direct hardware implementations of compression algorithms use LZ-based methods. It is desirable to provide a direct hardware-based implementation of the BWT and IBWT, which will allow data compression with high compression ratios and a very high throughout of data.

Known proposed hardware implementations of the BWT are described in:

[1] "*Prototyping of Efficient Hardware Algorithm for Data Compression in Future Communication Systems*" by A. Mukherjee, N. Motgi, J. Becker, A. Friebe, C. Habermann and M. Glesner, Proceedings of the 12th International Workshop on Rapid System Prototyping, (RSP'01), IEEE, 2001; and,

[2]. "*An FPGA-based Parallel Sorting Architecture for the Burrows Wheeler Transform*" by José Martínez, René. Cumplido and Claudia Feregrino, Proceedings of the 2005. International Conference on Reconfigurable Computing and FPGAs (ReConFig 2005).

The paper [1] by Mukherjee et al provides an outline of how the "Weavesorter" algorithm can be used to provide a hardware implementation of the BWT. Weavesorter is a modified shift register that compares pairs of registers with each other and is capable of swapping data as it passes data from one register pair to the next on the basis of the comparison. As data is passed through the shift register, the comparisons and resulting data swaps ensure that the higher valued characters are passed in preference to lower valued characters, thereby sorting the data. The Weavesorter algorithm was originally outlined by Amar Mukherjee in "*Introduction to nMOS and CMOS VLSI System Design*" published by Prentice Hall in 1986.

For use in the BWT, the addresses or position of each character in the original string is carried alongside the data through the Weavesorter shift register. The address is not used in the comparison but is swapped along with the data. The addresses are used to reference the original location of the character as they emerge in sorted order.

When used in this manner the modified Weavesorter algorithm sorts on the basis of the first character of each cyclic rotation of the original string. Further passes through the Weavesorter are required to resolve strings with common characters.

The number of passes required to fully order each cyclic rotation is data-dependent in the worst case N passes would be required. A pass requires 2N clock cycles.

This paper [1] also provides an outline of a method for avoiding periodic data based on an artificial lowest value character that is added to the string. This character is always lower than any real character and as such ensures an ordering.

The paper [2] by Martínez, Cumplido and Feregrino builds on the work of [1]. It provides an outline of an improved comparator, shift register and memory structure that reduces the number of clocks required for each pass by around 40%. A sentinel character that has a larger value than any real character is used to deal with periodic data.

As for [1], performance is data-dependent, potentially requiring a number of passes to fully order each cyclic rotation. In the worst case, N passes are required, although each pass requires fewer clocks than in [1].

According to a first aspect of the present invention, there is provided apparatus for transforming a block of data elements such that the order of the data elements is transformed, the apparatus comprising:

a plurality of first memory elements each for storing a respective one of the data elements in an initial order;

a plurality of second memory elements each for storing a respective one of the data elements in the initial order, each first memory element corresponding to a respective second memory element;

a plurality of comparators for comparing the contents of all respective pairs of the first and second memory elements;

the apparatus being arranged to shift the data elements in the second memory elements to different ones of the second memory elements after each comparison of the contents of the respective pairs of the first and second memory elements whilst maintaining the initial order of the data elements the comparators being arranged to compare the contents of all respective pairs of the first and second memory elements after each shift, the apparatus being arranged to repeat the shifts and comparisons until every data element has been compared with every other data element; and, combiners for combining the outputs of the comparators after each comparison to provide an output that can be used to order the data elements to a final order.

This apparatus provides a direct hardware-based, fully deterministic implementation of the BWT and/or IBWT, which allows data compression with high compression ratios and a very high throughout of data, which is much faster than can be achieved with a software implementation. The BWT and IBWT can be achieved with a single pass through the apparatus. The logic that is used in a practical embodiment scales in general nominally as order N, where N is the number of memory elements (though some parts in the worst case of the preferred embodiment scale as order $N \log_2 N$ as discussed further below). With only relatively minor modifications as discussed in detail below, basically the same apparatus can be used for the BWT and the IBWT.

In contrast, in the proposal in the paper [1] by Mukherjee and Motgi, in that prior art the number of data passes to fully order all cyclic rotations is data-dependent in the worst case, N passes are required, compared to a single pass with no data dependencies in the preferred embodiment of the present invention. Moreover, in the proposal in the paper [1], the data flow is different from that of the preferred embodiment of the present invention as ordering of the data takes place as it passes through a shift register. In addition, in the proposal in the paper [1], comparisons are between single characters whereas in the preferred embodiment of the present invention, comparisons are between whole N byte words.

As for the proposal in the paper [2] by Martïnez, Cumplido and Feregrino, again, performance in that prior art is data-dependent, potentially requiring a number of passes to fully order each cyclic rotation. In the worst case, N passes are required, though each pass requires fewer clocks than in [1].

In the case of the proposals in [1] and [2], the logic in general scales as order ($N+N \log_2 N$).

The apparatus may be arranged such that each comparison of the contents of all respective pairs of the first and second memory elements is carried out in a single clock cycle. The apparatus may be further arranged such that the data elements in the second memory elements are shifted to different ones of the second memory elements for the next clock cycle. This provides the fastest possible direct hardware implementation.

In an embodiment that is applicable for the BWT, the comparators are arranged to determine if the content of each first memory element is greater than or equal to the content of the corresponding second memory element, the combiners being arranged to combine the outputs of the comparators such that the outputs of the combiners represent whether each of the strings of data elements in the first memory elements that start at the different ones of the first memory elements is greater than or equal to the corresponding strings of data elements in the second memory elements at each comparison. This provides an efficient arrangement for determining the (lexicographical) order of all logical rotations of the block of data elements.

This embodiment of the apparatus may comprise a plurality of counters which are arranged to receive outputs from the respective combiners such that after every data element has been compared with every other data element, the counts stored in the counters represent the order of all logical rotations of the block of data elements. This provides an efficient arrangement for outputting the correct (lexicographical) order of the logical rotations of the block of data elements.

This embodiment of the apparatus may comprise a memory that is arranged to receive the outputs of the counters as write addresses, to receive a copy of the block of data elements shifted by one data element as write data, and to receive an output from an incrementing counter as read addresses, whereby the read data which is output by the memory is the transformed block of data elements. This use of a memory, which in an embodiment is dual-ported, provides for a fast and efficient outputting of the transformed block of data elements for the BWT.

In another embodiment that is applicable for the BWT, the comparators are arranged to determine if the content of each first memory element is less than or equal to the content of the corresponding second memory element, the combiners being arranged to combine the outputs of the comparators such that the outputs of the combiners represent whether each of the strings of data elements in the first memory elements that start at the different ones of the first memory elements is less than or equal to the corresponding strings of data elements in the second memory elements at each comparison. This provides an alternative to the "greater than or equal to" test of the embodiment described above.

This embodiment of the apparatus may comprise a plurality of counters which are arranged to receive outputs from the respective combiners such that after every data element has been compared with every other data element, the counts stored in the counters represent the order of all logical rotations of the block of data elements. The apparatus may comprise a memory that is arranged to receive the outputs of the counters as write addresses, to receive a copy of the block of data elements shifted by one data element as write data, and to receive an output from a decrementing counter as read addresses, whereby the read data which is output by the memory is the transformed block of data elements.

In preferred embodiments, the apparatus is arranged to store the output of a specified one of the counters as a reference position. This reference position is used in a preferred embodiment of the implementation of the IBWT and may for example be saved with the transformed block of data elements.

In an embodiment that is applicable for the BWT, the apparatus may comprise a plurality of bias elements that are arranged to provide a different bias at each comparison, the combiners combining the respective biases with the outputs of the comparators at each comparison. This provides for a bias function that can be used to deal with the fact that the block of data elements may have repeated characters and ensures that an implied order is overlaid, which allows identical blocks of data elements or other blocks of data elements having repeated patterns (as discussed further below) to be distinguished during the comparison phase.

In addition, or more preferably as an alternative, the number of first memory elements and the number of second memory elements may each be the same prime number, the apparatus being arranged to determine if all data elements in the block are the same. This is effective in distinguishing between blocks of data elements having repeated patterns because if the number of first memory elements and the number of second memory elements is each the same prime number, then there is no case where a repeated pattern (as discussed further herein) occurs except for the case where all characters are the same, which is also looked for in this embodiment.

In an embodiment that is applicable for the BWT, the combiners are arranged in successive stages such that the outputs of the comparators are passed to the inputs of respective pairs of the combiners of the first stage and the outputs of the combiners of one stage are passed to the inputs of respective pairs of combiners of the next stage until the final stage, the outputs of the combiners of the final stage providing the output that can be used to order the data elements to a final order. This staged approach is valuable in reducing the number of logic devices such that this portion of the logic scales as $N \log_2 N$ and not $N^2$ or worse (though other portions scale as order N as mentioned above and further herein).

The first memory elements and the second memory elements in the apparatus for transform and inverse transform may be implemented by registers (which may be flip flops or edge-triggered d-type flip-flops in particular). However, in the case of each type of apparatus, other types of memory elements may be used for storage of the data. For example, one or more of the sets of memory elements may be replaced by RAMs. An advantage of using RAMs is that fewer transistors are required than when using registers.

In an embodiment that is applicable for the IBWT, the comparators are arranged to determine if the content of each first memory element is greater than or equal to the content of the corresponding second memory element, the combiners being arranged to combine the outputs of the comparators such that the outputs of the combiners represent whether the first data element of each of the strings of data elements in the first memory elements that start at the different ones of the first memory elements is greater than or equal to the first data element of the corresponding strings of data elements in the second memory elements at each comparison.

In this embodiment of the apparatus, the comparators may be arranged to determine if the content of each first memory element is greater than or equal to the content of the corresponding second memory element, the combiners being arranged to combine the outputs of the comparators such that the outputs of the combiners represent whether the first data element of each of the strings of data elements in the first memory elements that start at the different ones of the first memory elements is greater than or equal to the first data element of the corresponding strings of data elements in the second memory elements at each comparison.

This embodiment of the apparatus may comprise:
a plurality of counters which are arranged to receive outputs from the respective combiners;
an incrementing counter;
a selector; and,
a memory that is arranged to receive the outputs of the counters as write addresses, to receive a copy of the block of data elements as first write data, to receive an output from the incrementing counter as second write data which is used by the memory to provide first read data, the selector being arranged to provide initially reference position data and subsequently the first read data as read addresses to the memory, whereby second read data which is output by the memory is the transformed block of data elements.

Alternatively, in this embodiment of the apparatus, the comparators may be arranged to determine if the content of each first memory element is less than or equal to the content of the corresponding second memory element, the combiners being arranged to combine the outputs of the comparators such that the outputs of the combiners represent whether the first data element of each of the strings of data elements in the first memory elements that start at the different ones of the first memory elements is less than or equal to the first data element of the corresponding strings of data elements in the second memory elements at each comparison.

This embodiment of the apparatus may comprise:

a plurality of counters which are arranged to receive outputs from the respective combiners;

a decrementing counter;

a selector; and, a memory that is arranged to receive the outputs of the counters as write addresses, to receive a copy of the block of data elements as first write data, to receive an output from the decrementing counter as second write data which is used by the memory to provide first read data, the selector being arranged to provide initially reference position data and subsequently the first read data as read addresses to the memory, whereby second read data which is output by the memory is the transformed block of data elements.

In an embodiment that is applicable for the IBWT, the apparatus may comprise a plurality of bias elements that are arranged to provide a different bias at each comparison the combiners combining the respective biases with the outputs of the comparators at each comparison. This provides an effective way of preserving the order of the block of data elements to provide the stable sort that is discussed above.

Again, the first memory elements and the second memory elements may be registers (as discussed above and further herein). As an alternative, the first memory elements and the second memory elements may be RAMs.

According to a second aspect of the present invention, there is provided a method of transforming a block of data elements such that the order of the data elements is transformed, the method comprising:

storing the data elements in an initial order in respective ones of a plurality of first memory elements;

storing the data elements in the initial order in respective ones of a plurality of second memory elements, each first memory element corresponding to a respective second memory element;

comparing the contents of all respective pairs of the first and second memory elements;

shifting the data elements in the second memory elements to different ones of the second memory elements after each comparison of the contents of the respective pairs of the first and second memory elements whilst maintaining the initial order of the data elements;

repeating the shifts and comparisons until every data element has been compared with every other data element; and, combining the results of the comparisons after each comparison to provide a result that can be used to order the data elements to a final order.

Preferred embodiments of the method correspond to the preferred embodiments of the apparatus discussed above.

The data elements may each be a single byte. On the other hand, the data elements may each be a fixed number of plural bytes.

Embodiments of the present invention will now be described by way of example with reference to the accompanying drawings, in which.

Figure 1:
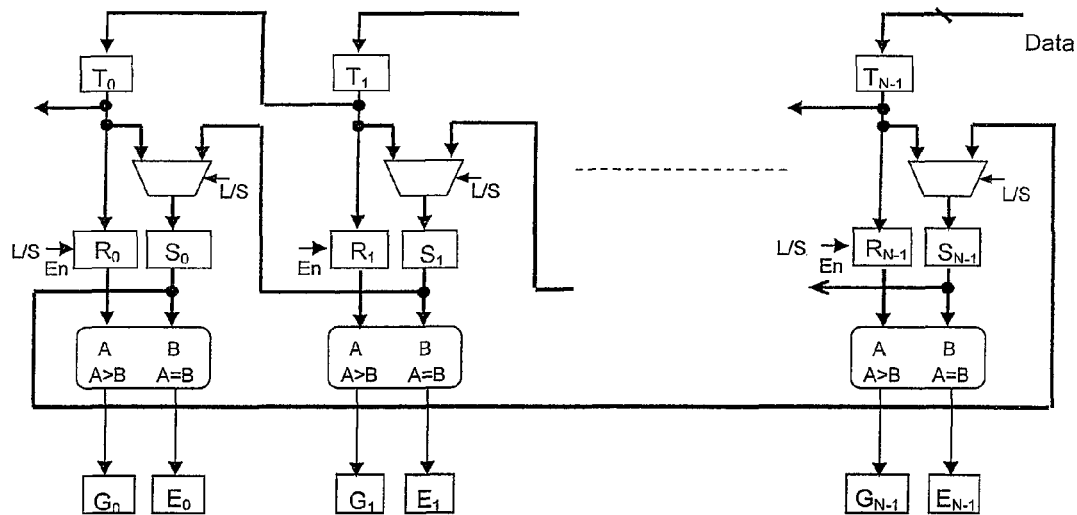
FIGS. 1 to 8 show schematically portions of an example of an embodiment of apparatus according to the present invention that is used for implementing the Burrows Wheeler Transform.

Referring first to FIG. 1, in an example of an embodiment of the present invention, data is processed in blocks of N bytes each (or other unit size, such as N/M M-byte words). The data is first shifted into N temporary registers T, $T_0$ to $T_{N-1}$, of storage capacity 1 byte (or M bytes in the case that M byte words are being processed) until a whole block is received. The data is then transferred into further sets of registers for processing as discussed further below. While a block is being processed in the subsequent sets of, registers, the next block can be shifted into the temporary registers T. (For completeness, it is noted that whilst here the term "register" is used as is conventional in the art, in practice these are edge-triggered D-type flip flops, as will be understood by those skilled in the art.)

During processing, N registers $R_0$ to $R_{N-1}$ of 1 byte each (or N/M words) hold a copy of the data block, referred to herein as "reference data" (R), which is received from the temporary registers T. A load/shift (L/S) signal is used to enable the "reference data" registers $R_0$ to $R_{N-1}$ at the end of each block.

N registers $S_0$ to $S_{N-1}$ of one byte each (or N/M words) are also loaded initially with a copy of the data block from the temporary registers T, this referred to herein as "shift data" (S). As shown in FIG. 1, during processing, shift data is shifted from one shift register $S_0$ to $S_{N-1}$ to the next, with the contents of the first register feeding the last register to provide a rotate function. The load/shift (L/S) signal is used to enable the rotate function of the shift registers $S_0$ to $S_{N-1}$.

In accordance with the Burrows Wheeler Transform, it is necessary to "order" all N rotations of the N-byte word, i.e. to sort the rotations according to some rule, such as to sort them lexicographically. To achieve this, the bytes of reference data and shift data in the respective reference registers $R_0$ to $R_{N-1}$ and shift registers $S_0$ to $S_{N-1}$ are compared. In this embodiment, each comparison yields two results:

$E_N$ is given by $R_N = S_N$ $G_N$ is given by $R_N > S_N$ (Results are produced for each combination of bytes in a word if the data is stored in words.)

Those practised in logic design will recognise that, at least in some circumstances, operating clock speed can be increased at the expense of latency by "pipelining". The comparison results may be registered at this stage if pipelining is required. In FIG. 1, these optional registers where the comparison results can be stored are indicated schematically by the $G_n$ and $E_n$ boxes.

Figure 2:
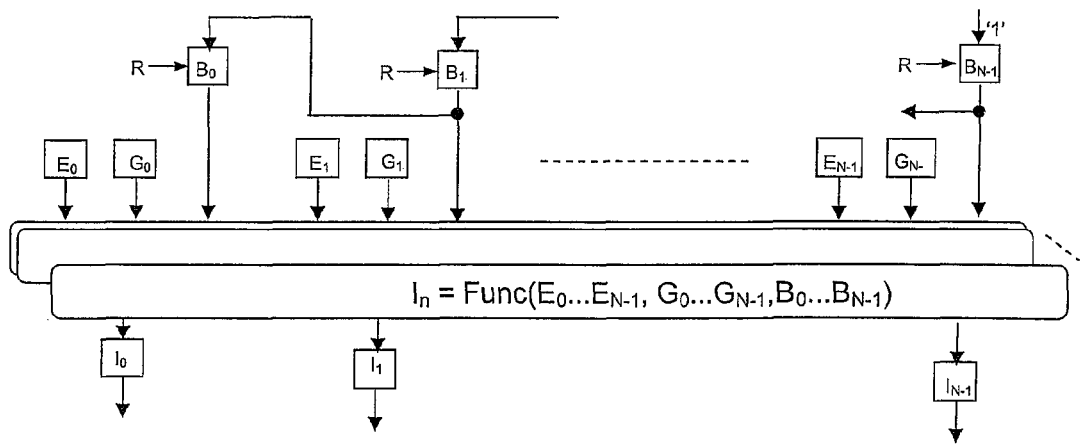

Referring next to FIG. 2, $E_N$ and $G_N$ are then combined as discussed below to form the results of N N-byte word comparisons (or for each byte shift if the data is stored as words). This stage may also be pipelined (i.e. the intermediate calculation results stored in registers, not shown in the drawings) for performance.

$I_0$ represents the comparison of the word $R_0, R_1 \ldots R_{N-1}$ with each logical rotation of $S_0, S_1 \ldots S_{N-1}$ at each clock cycle. $I_1$ represents the comparison of the next logical rotation ($R_1 \ldots R_{N-1}, R_0$) with each logical rotation of $S_1 \ldots S_{N-1}, S_0$ at each clock cycle, and so on. Thus, at time t=0, $I_0$ represents the result of the comparison of the word $R_0, R_1 \ldots R_{N-1}$ with the word $S_0, S_1 \ldots S_{N-1}$, etc., such that at time t=0:

$$I_0 = R_0, R_1 \ldots R_{N-1} > S_0, S_1 \ldots S_{N-1}$$

$$I_1 = R_1 \ldots R_{N-1}, R_0 > S_1 \ldots S_{N-1}, S_0$$

$$I_2 = R_2 \ldots R_{N-1}, R_0, R_1 > S_2, \ldots S_{N-1}, S_1, S_2$$

etc.

At the next clock cycle, when the data in the shift registers has been shifted from one shift register to another, the comparison is repeated so that the word $R_0, R_1 \ldots R_{N-1}$ is compared with another combination of the word held in $S_0, S_1 \ldots S_{N-1}$, the word $R_1 \ldots R_{N-1}, R_0$ is compared with another combination of the word held in $S_1 \ldots S_{N-1}, S_0$, and so on. After N clock cycles, the word $R_0, R_1 \ldots R_{N-1}$ and all its logical rotations will have been compared with all other logical rotations.

Some arrangement is made to deal with the fact that the block of data may have repeated characters (or, more specifically, repeated patterns of length X where N mod X=0) because there will be rotations that, at face value, are the same, but that in fact represent different orderings or rotations of the original word. One way to achieve this is to tag a unique "tag" number to an end of each N-byte word. In the event that one N-byte word is the same as another, the corresponding unique tag numbers can be compared to distinguish these different orderings of the original word. It should be noted that because there are in effect N N-byte words in each set of registers (each N-byte word starting at each character/register of the respective sets), then in principle a tag number is required for each of the N bytes in the word. The tag number would need to have a range of at least $\log_2 N$. This means that a naïve implementation of this would require. N $\log_2$ N bits and corresponding comparison logic, which would be a heavy requirement in logic given that N may well be very large.

A more efficient implementation, and one which is preferred is predicated on the fact that only the result of the comparison of the tag numbers is actually required and, further, that in fact it is sufficient to use a comparison of each tag number with a fixed, reference number. This is achieved in the preferred embodiment by using an N bit "bias" register $B_0$ to $B_{N-1}$ to ensure an implicit ordering of exact words or words containing repeated patterns. This register is reset initially to 0. On the first clock cycle, a fixed "1" is shifted into the last bias register $B_{N-1}$. At the next clock cycle, the "1" in the bias register $B_{N-1}$ is moved to the adjacent bias register $B_{N-2}$ and a "1" shifted into the last bias register $B_{N-1}$. This is repeated at each clock cycle such that after N clock cycles, all of the bias registers contain a "1". This ensures that an implied order is overlaid, which allows identical words (in which all N bytes are equal) or other words having repeated patterns filling the N bytes to be distinguished during the comparison phase.

An alternative way of dealing with the fact that the block of data may have repeated characters (or as mentioned above, more specifically, repeated patterns of length X, where N mod X=0) is to make N a prime number and to detect if all characters in the block are the same. This is effective because if N is a prime number, then there is no value of X for which N mod X=0 except for the case where all characters are the same. A number of ways of detecting if all characters in the block are the same are possible. For example, a comparison may be made of the first character, which may be saved in a register, with each new character as each new character arrives.

The following description assumes that the bias method described above is used to deal with repeated characters.

The present embodiment compares the contents of the reference registers R and shift registers S to determine which word is (lexicographically) larger than the other in the following manner. The function I is arranged such that if the content of the first reference register under consideration is greater than the content of the first shift register under consideration (i.e. $R_0 > S_0$ for $I_0$, $R_1 > S_1$ for $I_1$, etc.), then $I_N = 1$ because it can immediately be seen that the whole word beginning at the first reference register under consideration is greater than the whole word beginning at the first shift register under consideration. If the content of the first reference register under consideration is less than the content of the first shift register under consideration, then I=0 because it can immediately be seen that the whole word beginning at the first reference register under consideration is less than the whole word beginning at the first shift register under consideration. Otherwise, if the contents of the first reference and shift registers under consideration are the same, it is necessary to compare the contents of the next reference and shift registers to see whether the respective second characters are the same or which is greater. (By analogy, consider comparing the decimal numbers 2234 and 1123 to see which is larger. By comparing the first digits (here, 2 and 1) it can be seen immediately that the first number is greater than the second number. Consider then comparing the decimal numbers 1123 and 1234 to see which is larger. In this case, the first digits (here, 1) are the same so it is then necessary to consider the next digits, which in this case are 1 and 2 respectively so it then can be seen that the first number is smaller than the second number.)

In summary therefore, as indicated in FIG. 2:

$I_0$ is given by:

$$G_0 + E_0 \cdot G_1 + E_0 \cdot E_1 \cdot G_2 + \ldots + E_0 \cdot E_1 \ldots E_{N-2} \cdot G_{N-1} + E_0 \cdot E_1 \ldots E_{N-1} \cdot B_0$$

(i.e. $I_0$ is 1 if $R_0 > S_0$, or if $R_0 = S_0$ AND $R_1 > S_1$, or if. $R_0 = S_0$ AND $R_1 = S_1$ AND $R_2 > S_2$, etc., or all of $R_1 = S_n$ and bias $B_0 = 1$), else $I_0 = 0$ indicating that the word beginning at $R_0$ is less than the word beginning at $S_0$.)

$I_1$ is given by:

$$G_1 + E_1 \cdot G_2 + E_1 \cdot E_2 \cdot G_3 + \ldots + E_1 \cdot E_2 \ldots E_{N-1} \cdot G_0 + E_1 \cdot E_2 \ldots E_{N-1} \cdot E_0 \cdot B_1$$

$I_2$ is given by:

$$G_2 + E_2 \cdot G_3 + E_2 \cdot E_3 \cdot G_4 + \ldots + E_2 \cdot E_3 \ldots E_{N-1} \cdot E_0 \cdot G_1 + E_2 \cdot E_3 \ldots E_{N-1} E_0 \cdot E_1 \cdot B_2$$

and so on up to $I_{N-1}$ (it being borne in mind that in this notation, the symbol "+" is used to indicate a logical "OR" and the symbol "·" is used to indicate a logical "AND").

Figure 3:
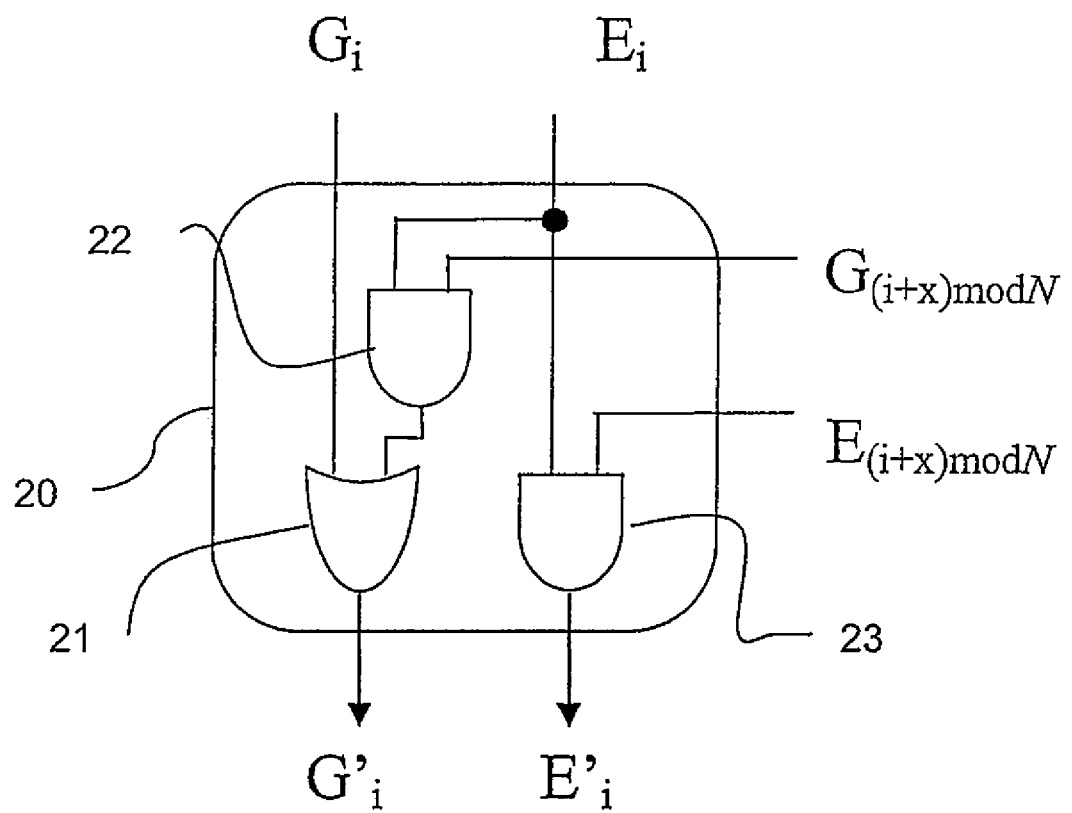

This part of the apparatus for the I function (i.e. the AND and OR functions discussed above) can be reduced by using a tiered or staged approach in combination with cells that combine two results, in effect to re-use the results. Referring to FIG. 3, an example of a suitable "elemental" cell 20 has an OR gate 21 which receives as one input the value from $G_i$. The other input of the OR gate 21 is from a first AND gate 22 which has a first input $E_i$ and a second input $G_{(i+x)mod N}$ where, x is equal to $2^s$ where s is the stage number concerned (see below). $E_i$ is also an input to a second AND gate 23 which receives, $E_{(i+x)mod N}$ as its other input. The operation of these AND and OR gates 21,22,23 is such that the output of the OR gate 21 is $G'_i$ and the output of the second AND gate 23 is $E'_i$. The mod N term indicates that the last input wraps around to the first input.

Figure 4:
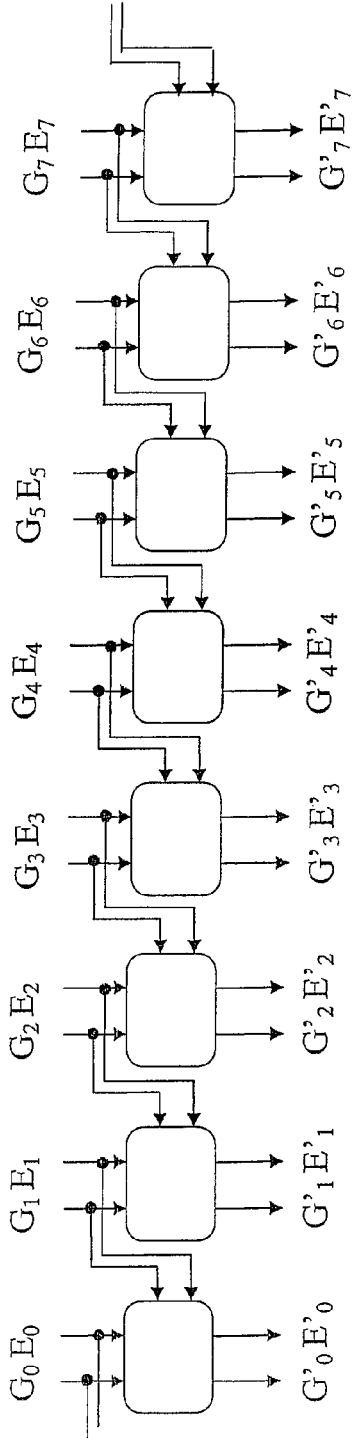
Figure 5:
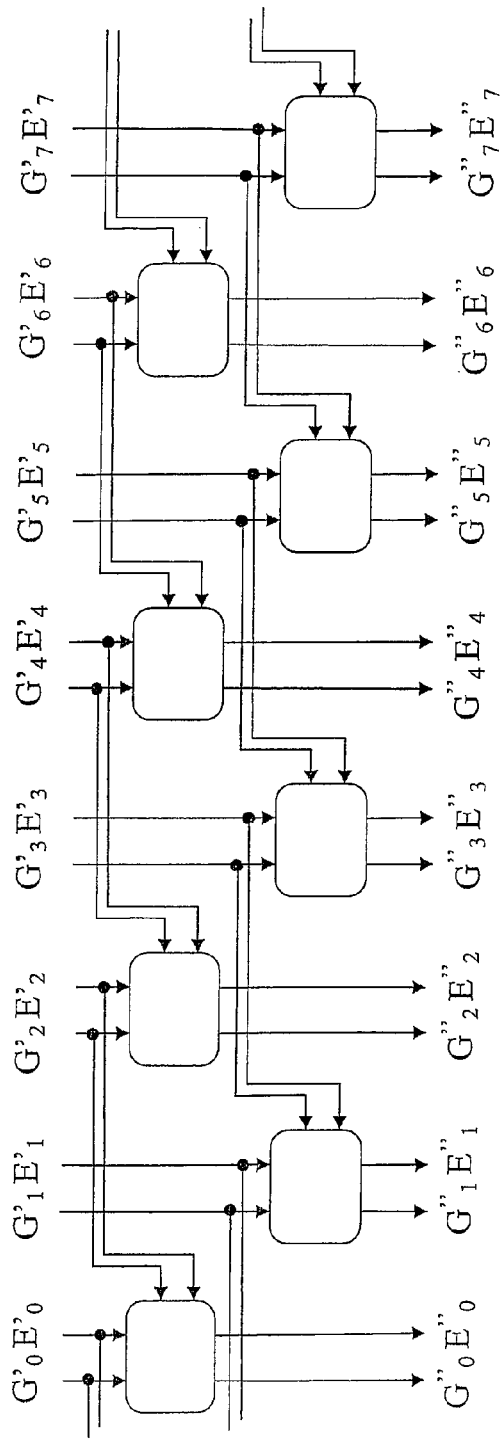
Figure 6:
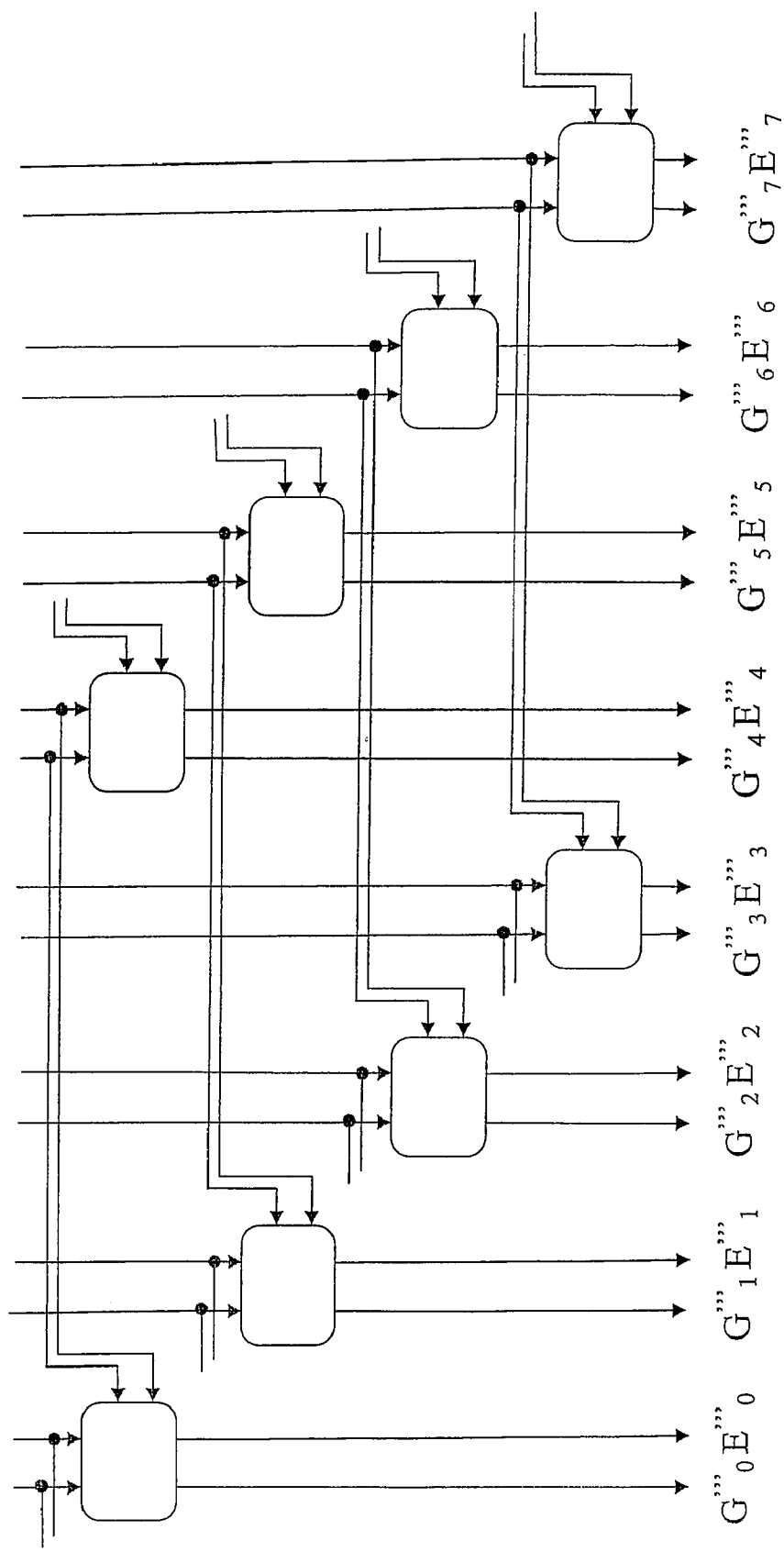

To use this staged approach, the number of stages that is required is $\log_2 N$, where N is the number of bytes in the block that is being processed. Thus, in a simple example, if N=8, then three stages ($\log_2 8=3$) are required. This can be seen in the example shown in FIGS. 4 to 6. In these figures, the outputs from one stage are passed as inputs to the next stage (directly downwards in the drawings) but this is only shown explicitly in FIG. 5 for reasons of clarity.

Figure 7:
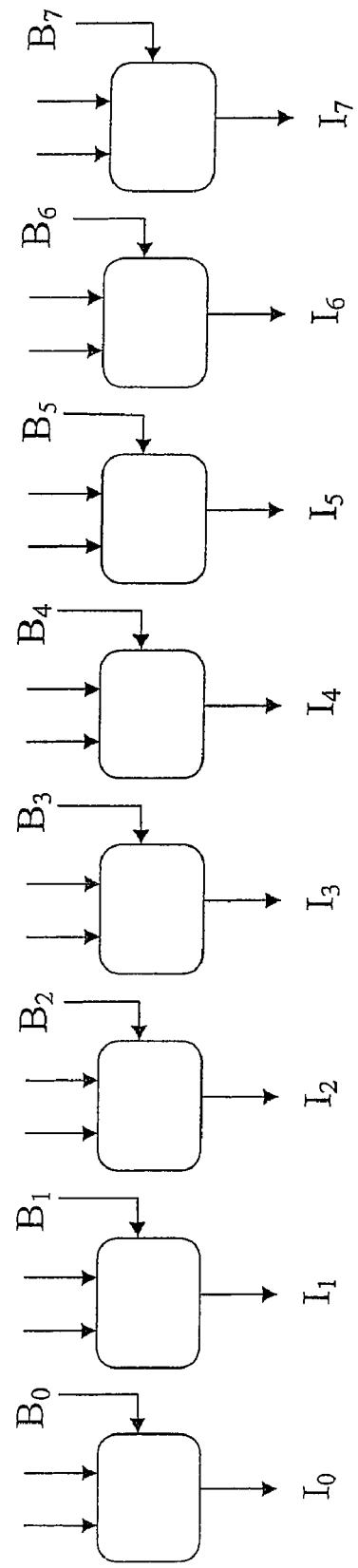

FIG. 7 shows the final stage of this part of the apparatus in which the bias B is combined to give the values of I at each clock cycle.

This staged approach is valuable in reducing the number of logic devices such that this portion of the logic scales as N $\log_2$ N and not $N^2$ or worse (though other portions scale as order N). In practice, N may be very large (e.g. 128K) so this is particularly useful.

As above, additional pipeline registers can be added at each stage to improve performance (i.e. store the values of E'G', E"G/", etc. to reduce the logic between registers to increase speed).

Summarising so far, data from the block being processed is passed first to the temporary registers T and from there to both the reference registers R and the shift registers S. A comparison is made between the contents of respective pairs of reference registers $R_n$ and shift registers $S_n$ in each clock cycle and effectively a note made of which has the greater value or when they are equal N comparisons are therefore made on each clock cycle. On the next clock cycle, the contents of the respective shift registers S are shifted to the next shift register and the comparison with the respective reference registers is made again. This process is repeated until all of the different orderings of the block in the shift registers have been compared, i.e. after N clock cycles. A bias may be combined or N may be made a prime number in order to deal with repeated characters in the input data block.

It can be seen that because N comparisons are made during each clock cycle (i.e. the contents of the N shift registers $S_0$ to $S_{N-1}$ are compared with the contents of the N reference registers $R_0$ to $R_{N-1}$), $N^2$ comparisons are made in the N clock cycles.

Figure 8:
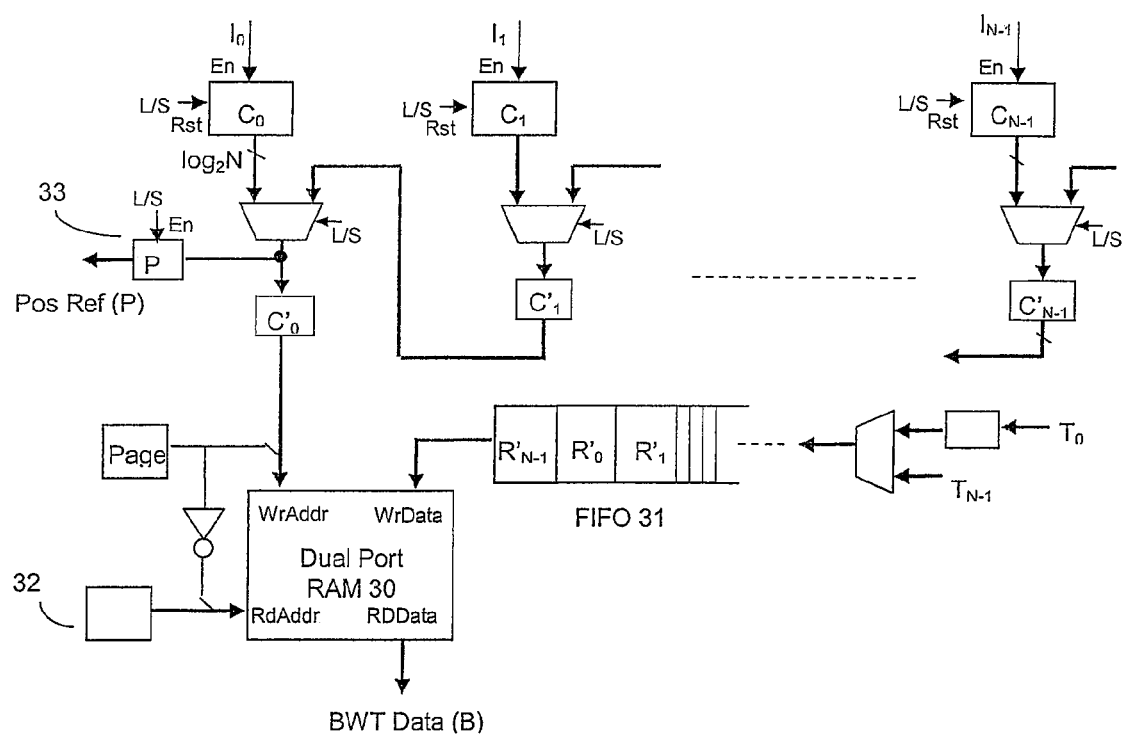

Referring next to FIG. 8, on each clock cycle, the final outputs $I_0$ to $I_{N-1}$ act as enables for N counters $C_0$ to $C_{N-1}$ each of $\log_2 N$ bits. Each counter C, which in this example are implemented as registers, increments for each N-byte value that is greater than the other logical rotations of N-byte values (with a bias to ensure an implicit ordering in the case of equal values as mentioned above). In the case that the operation is carried out on N bytes (i.e. one byte per cycle), then after N cycles, the counts $C_0$ to $C_{N-1}$ represent the order of the logically rotated N byte numbers. In the case that operation is carried out on N/M M-byte words (i.e. M bytes per cycle), then this occurs after N/M cycles.

The count values are saved in a duplicate set of registers C' to allow the next block to be processed. These registers have multiplexers to allow the results to be shifted out while the next block is processed. The count value of the first value $C_0$ is saved in a register 33 and output as a reference position P (Ref Pos (P)). Because each count value $C_0$, $C_1$, $C_2$ ... is the position in the sorted list of the N byte word starting at the relative position 0, 1, 2 ..., this means that $C_0$ is the position in the sorted list of the original N byte word which was stored in $T_0$, $T_1$, $T_2$ ... and can therefore be used as a marker for this, i.e. as a reference position for the original N byte word.

The saved count values C' are then used to order the data block. As each count is shifted out it forms the write address (i.e. the position in order) for a dual-port RAM 30 which is 2N bytes in size. A saved set of reference data R' forms the write data R' may be constructed from a delay of data from the input shift register T which is achieved by using a FIFO 31. The FIFO data is shifted by one byte to select the last column of the ordered set in accordance with the BWT definition. The dual-port RAM 30 is preferably paged to allow one block to be written as the previous block is read out.

Data is read from the RAM 30 via an incrementing counter 32 that drives the read address. This forms the transformed data output B, i.e. the output B is the Burrows-Wheeler transform of the input data block.

Figure 16:
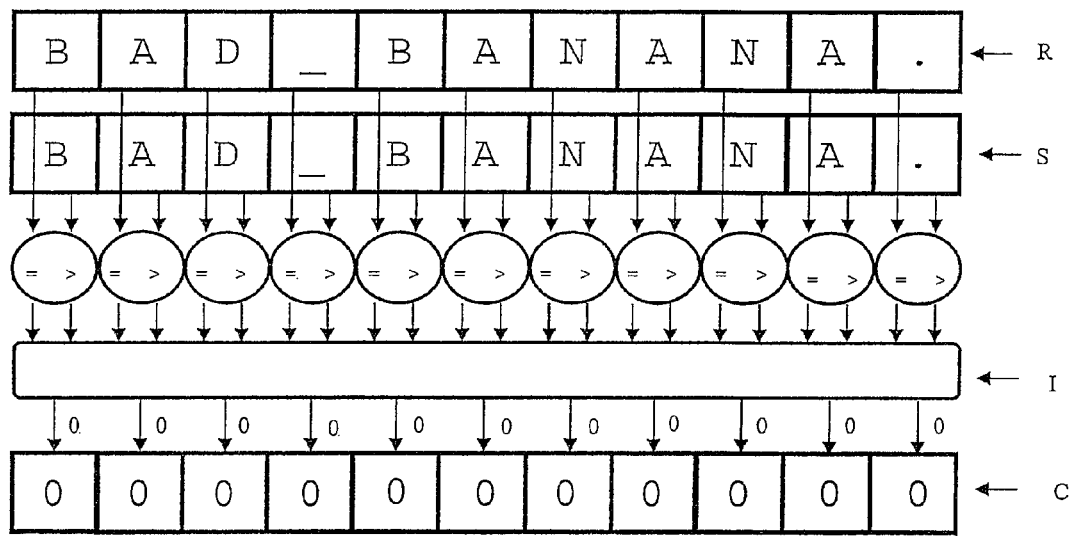
FIGS. 16 to 20 show schematically an example of the BWT implemented in accordance with an embodiment of the present invention; and, FIG. 21 show schematically the splitting of an N-byte block is split into "n" smaller sub-blocks, which is particularly useful when RAMs are used instead of some of the registers of the earlier examples.

The process is illustrated schematically by way of example in FIGS. 16 to 20. FIG. 16 shows the situation at clock cycle 1 in which the characters. B A D_B A N A NA have been loaded into the respective reference registers $R_0$ to $R_{10}$ and shift registers $S_0$ to $S_{10}$. (Here, the symbol "_" is used to represent a space, which is "less than" A, B, C, ... in the normal ASCII representation of characters.) The values for $C_0$ to $C_{N-1}$ are initially zero. (For simplicity in this example, the bias function B discussed above is not shown.)

Figure 17:
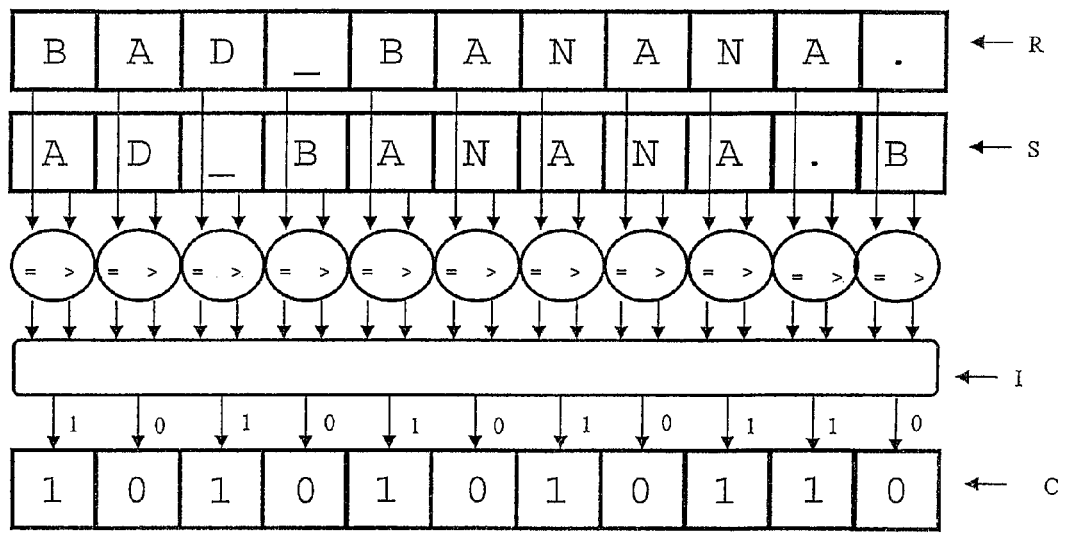

Next, as shown in FIG. 17, at clock cycle 2, the data in the respective shift registers S is shifted to the next shift register (wrapping the contents of the first shift register to the last shift register), and the contents of the respective reference registers R and shift registers S are then compared. As can be seen, in this example, the content of the first reference register $R_0$ (in this case, the character B) is greater than the content of the corresponding shift register $S_0$ (in this case, the character A), which immediately indicates that the word starting at $R_0$ is (lexicographically) greater than the word starting at $S_0$ on this clock cycle. Accordingly, $I_0$ at clock cycle 2 is 1, thus increasing the value of the corresponding counter register $C_0$ to 1. On the other hand, the content of the second reference register $R_1$ (in this case, the character A) is less than the content of the corresponding shift register $S_1$ (in this case, the character D) which immediately indicates that the word starting at $R_1$ is (lexicographically) less than the word starting at $S_1$ on this clock cycle. Accordingly, $I_1$ at clock cycle 2 is 0 and so the value of the corresponding counter register $C_1$ is 0.

Figure 18:
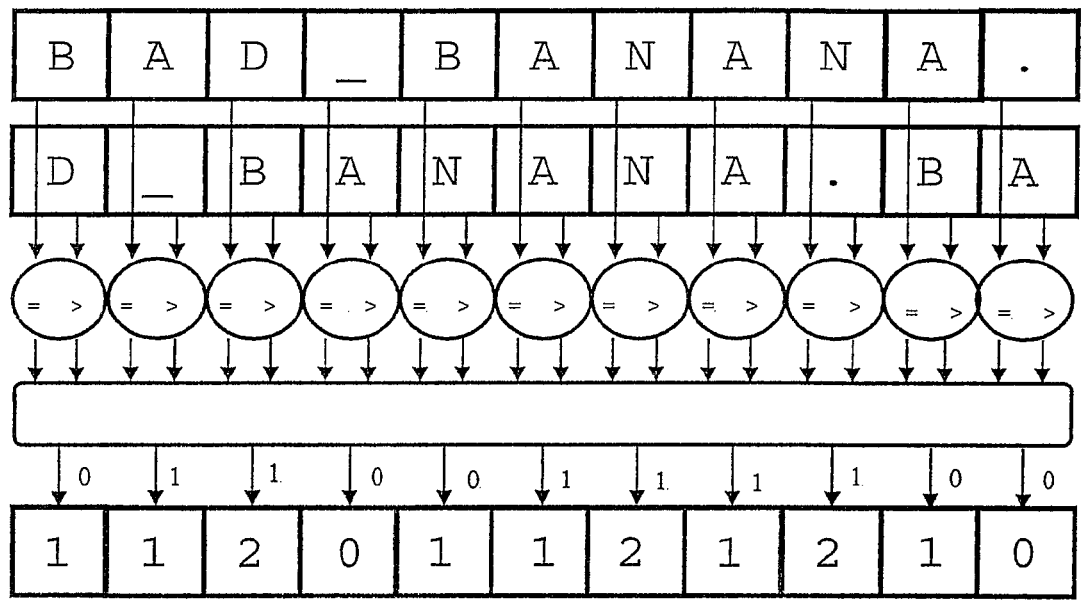

Next, as shown in FIG. 18, at clock cycle 3, the data in the respective shift registers S is shifted again to the next shift register (wrapping the contents of the first shift register to the last shift register), and the contents of the respective reference registers R and shift registers S are then compared. As can be seen, in this example at clock cycle 3, the content of the first reference register $R_0$ (in this case, the character B) is less than the content of the corresponding shift register $S_0$ (in this case, the character D) so $I_0$ at clock cycle 3 is 0 and the value of the corresponding counter register $C_0$ remains 1. On the other hand, the content of the second reference register $R_1$ (in this case, the character A) is greater than the content of the corresponding shift register $S_1$ (in this case, the character _) so $I_1$ at clock cycle 3 is 1 and the value of the corresponding counter register $C_1$ increases by 1 to 1.

Looking at the seventh reference register $R_6$ and the corresponding shift register $S_6$ in FIG. 18, in this clock cycle both registers have the same character (here, N). Thus, to determine whether the word starting at reference register $R_6$ is greater than the word starting at shift register $S_6$, it is necessary to consider the next characters of each word, i.e. to compare the contents of the eighth reference register $R_7$ and the eighth shift register $S_7$. In this case, however, the eighth reference register $R_7$ and the eighth shift register $S_7$ contain the same character (here, A). It is therefore necessary to consider the next registers $R_8$ and $S_8$. In this case, the reference register $R_8$ contains N and the shift register $S_8$ contains so it can be seen that the word starting at $R_6$ is greater than the word starting at $S_6$. Accordingly, $I_6$ is 1 and the value in the corresponding counter $C_6$ is increased by 1 accordingly.

Figure 19:
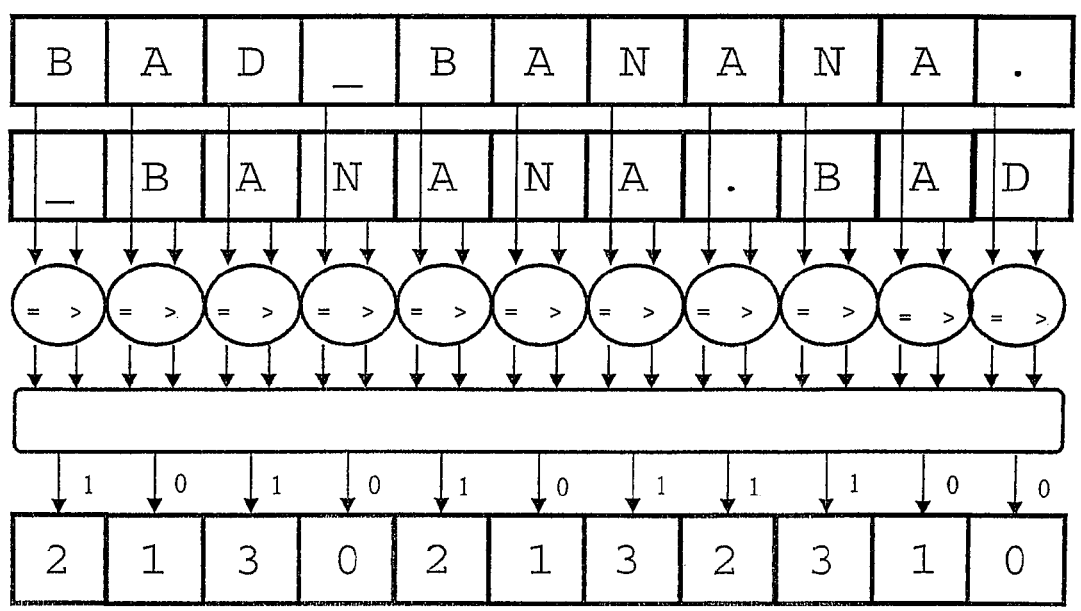

Next, as shown in FIG. 19, at clock cycle 4, the data in the respective shift registers S is shifted again to the next shift register (wrapping the contents of the first shift register to the last shift register), and the contents of the respective reference registers R and shift registers S are then compared. As can be seen, in this example at clock cycle 4, the content of the first reference register $R_0$ (in this case, again the character B) is greater than the content of the corresponding shift register $S_0$ (in this case the character _) so $I_0$ at clock cycle 4 is 1 and the value of the corresponding counter register $C_0$ increases by 1 to 2. On the other hand, the content of the second reference register $R_1$ (in this case, the character A) is less than the content of the corresponding shift register $S_1$ (in this case, the character B) so $I_1$ at clock cycle 2 is 0 and so the value of the corresponding counter register $C_1$ remains 1.

Figure 20:
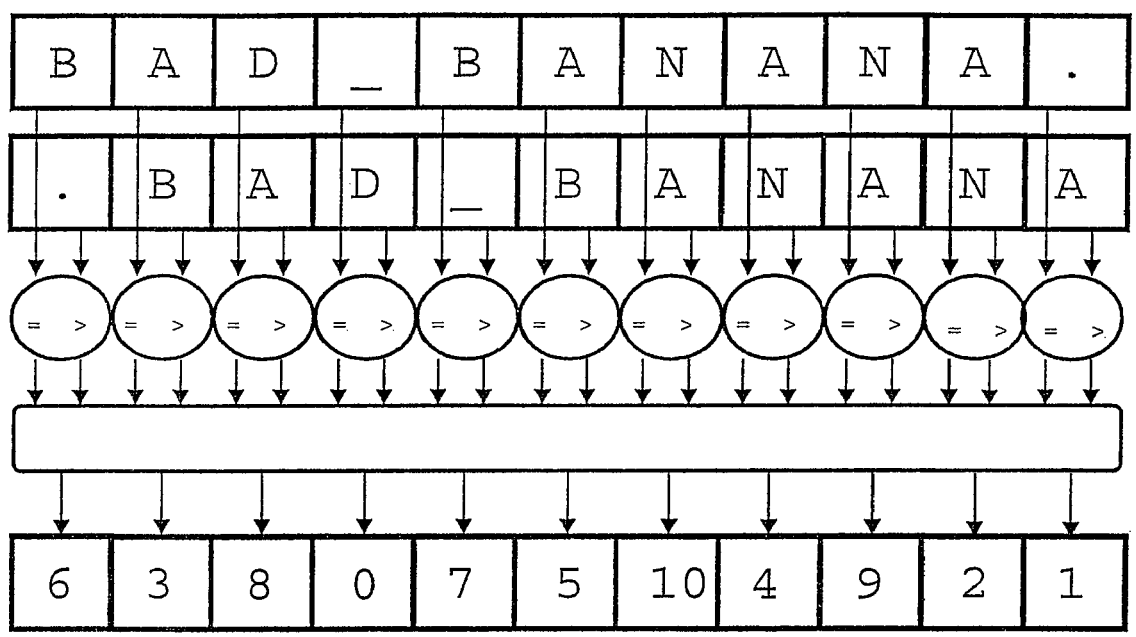

Ultimately, as shown in FIG. 20, after N clock cycles (here N=11, the number of characters in the "block" BAD_BA-NANA.), the final count values in the count registers $C_0$ to $C_{N-1}$ are obtained, in this example as 6, 3, 8, 0, 7, 5, 10, 4, 9, 2, 1. These count values are used to order the data block as discussed above in order to obtain as an output the transformed data block B.

As mentioned in the introduction above, for the inverse, transform, it is sufficient to sort the transformed string once with a stable sort, and remember where each character moved. Starting at the character corresponding to the "Ref Pos (P)", a cyclic permutation can then be performed by "walking" back up the sorted transformed string, the output of this being the original string. The preferred apparatus and method for achieving the inverse transform operates on this principle and, separately, is similar in many respects to the apparatus and method for achieving the transform.

Figure 9:
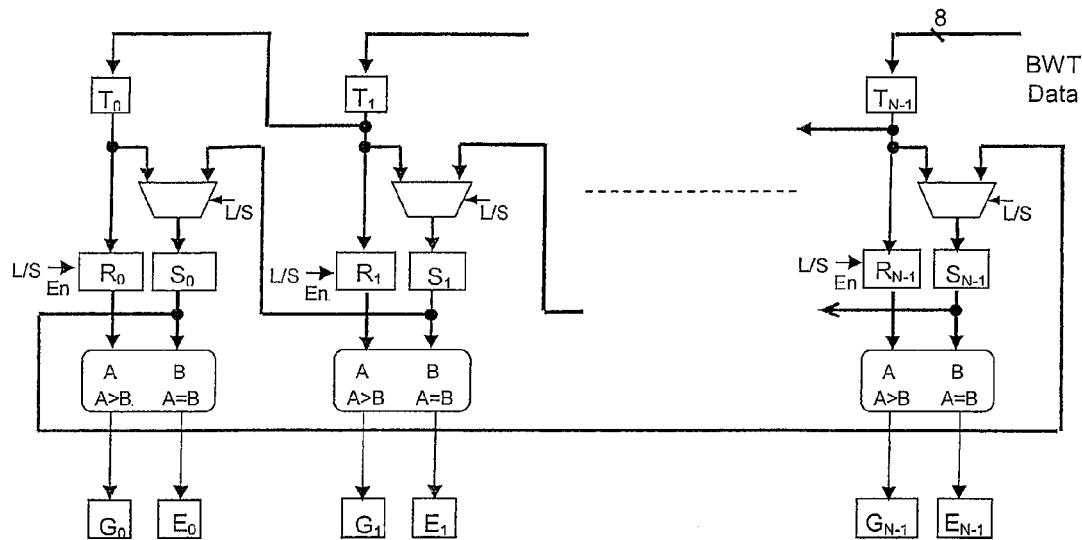
FIGS. 9 to 11 show schematically portions of an example of an embodiment of apparatus according to the present invention that is used for implementing the inverse Burrows Wheeler Transform.

Referring to FIG. 9, the structure of the T, R and S registers and the comparison logic is the same as for the transform (see FIG. 1 and the related description above). The incoming, transformed data block which is to be inverse-transformed back to the original data block is ordered in a similar way as in the transform process, but comparisons only need to be based on the first byte of each N-byte word only (see the discussion of the inverse BWT in the introduction above). The ordering preserves the order as received in the case of equal bytes (i.e. it is a stable sort). An N bit "bias" register $B_0$ to $B_{N-1}$ is used to ensure order preservation. Similarly as in the example of the transform that uses a bias register, this register in the inverse is initially reset to 0 and a fixed 1 is shifted in at each clock cycle.

Figure 10:
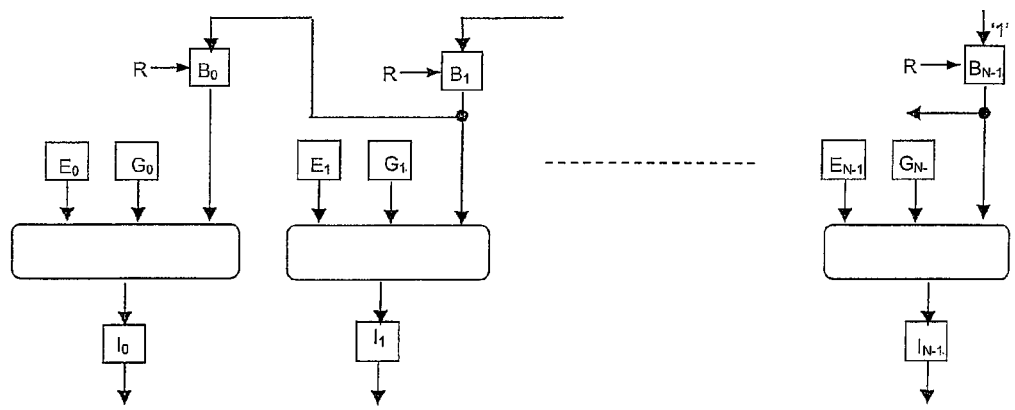

Thus, and referring to FIG. 10:

$I_0$ is given by:

$G_0 + E_0 \cdot B_0$ $I_1$ is given by:

$G_1 + E_1 \cdot B_1$ $I_2$ is given by:

$G_2 + E_2 \cdot B_2$ and so on.

Figure 11:
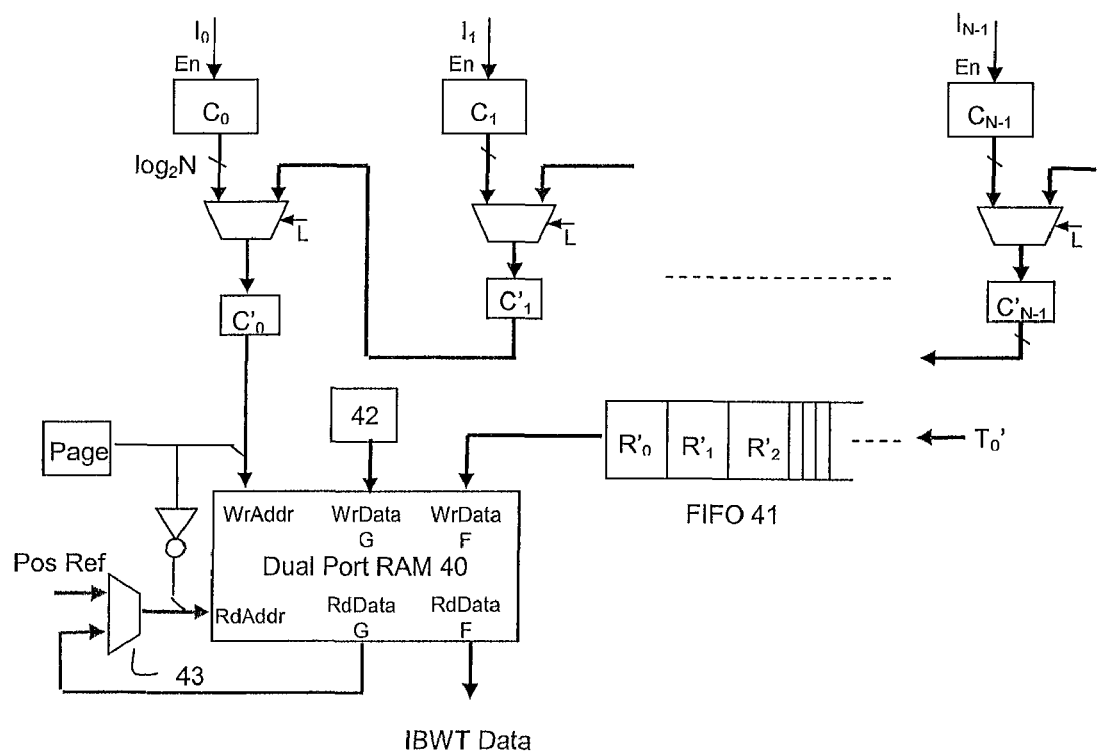

The structure of the counters C and C' is the same as for the transform. However, the dual-port memory structure is different. In particular, referring to FIG. 11, the saved count values C' are used to order the transformed data block $T_0'$. As each count is shifted out it forms the write address (i.e. the position in order) for the dual-port RAM 40 which has 2N entries of 2 bytes each. A saved set of reference data R' forms a first set F of write data R' may be constructed from a delay of the transformed data block $T_0'$ data which is achieved in this example by using a FIFO 41. A second set G of write data is provided by an incrementing counter 42 that drives the output of corresponding read data G. This read data G is used alongside the reference position P (Ref Pos (P)) (which is saved with the transformed data block as discussed above) to provide read address data. In particular, a multiplexer 43 is used to select between the saved reference position P and read data G. For a given block of N bytes, the first read of the RAM 40 uses the reference position P as the read address. The data stored at this address determines the address that is used for the next read, the multiplexer 43 switching so as to use the read data G for subsequent reads after the first. This process is repeated, i.e. each read from the RAM 40 providing the next read address, until the end of the block is reached. The effect of this is that, starting at the character corresponding to the "Ref Pos", a cyclic permutation is performed by "walking" back up the sorted transformed string, such that the output of this is the inverse BWT of the transformed string, i.e. the original string that was input to the transform, in accordance with the BWT.

As in the case of the transform, the dual-port RAM 40 of the inverse BWT is preferably paged to allow one block to be written as the previous block is read out.

As will be understood by those skilled in the art, not least because of the very similar arrangements, it is straightforward to produce a single apparatus that can carry out both the transform and the inverse transform with minimal additional logic circuits being required.

The examples described above operate at an effective rate of one byte (or character) per clock cycle (i.e. N bytes in N cycles). Higher throughput rates can be obtained by using additional logic circuits. It should be noted that performance, in terms of bytes per cycle, is not related directly to N since more pipeline registers at various stages may be added as N is increased.

Figure 12:
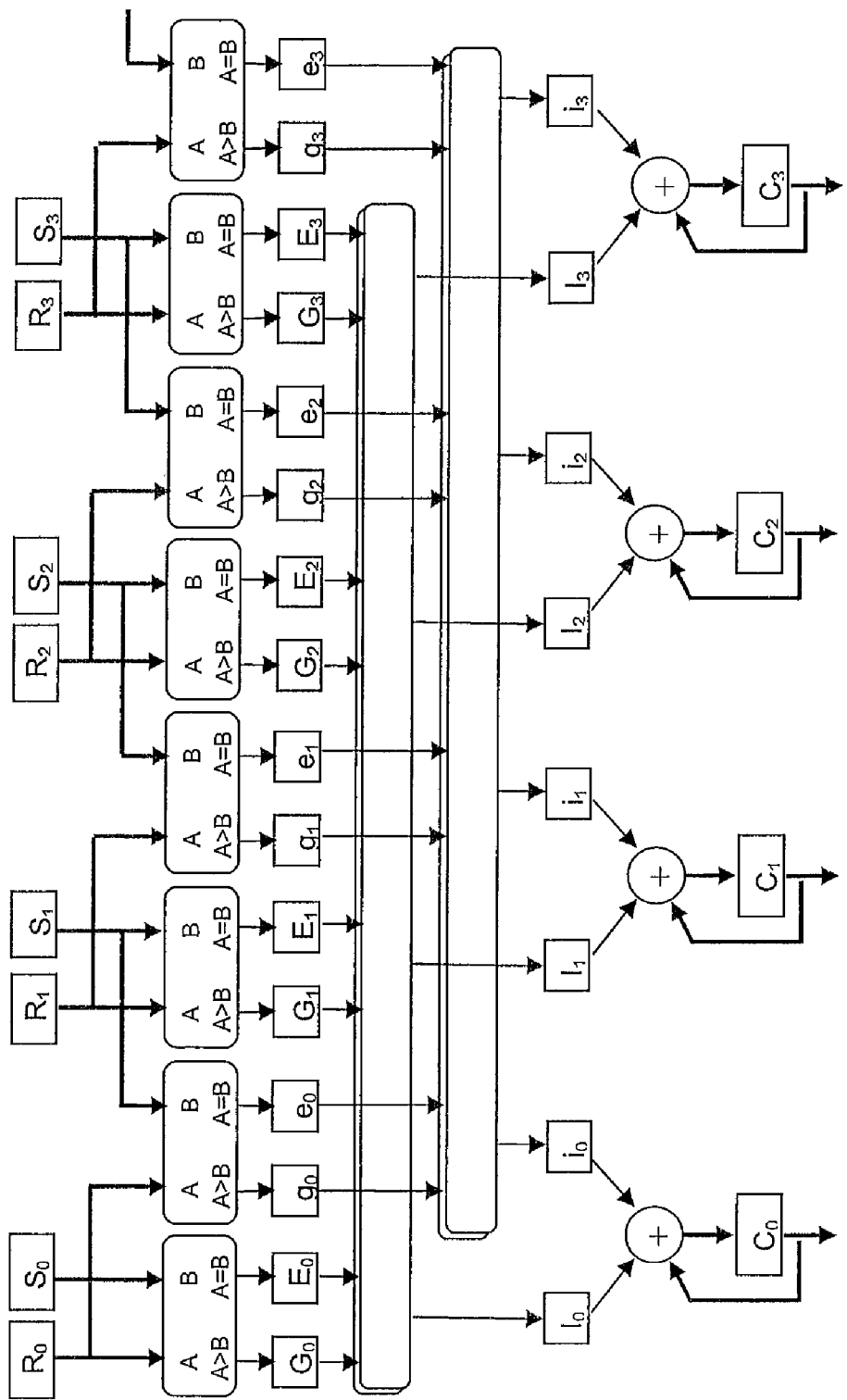
FIGS. 12 and 13 show schematically portions of a second example of an embodiment of apparatus according to the present invention in which plural bytes are processed per cycle.

By way of example, and referring to FIG. 12, operating at 2 bytes per cycle requires calculating 2 sets of N comparisons per clock cycle and shifting 2 bytes in each cycle instead of 1. So, at each clock:

$S_0 = S_2, S_1 = S_3 \ldots S_{n-2} = S_0, S_{N-1} = S_1$

Figure 13:
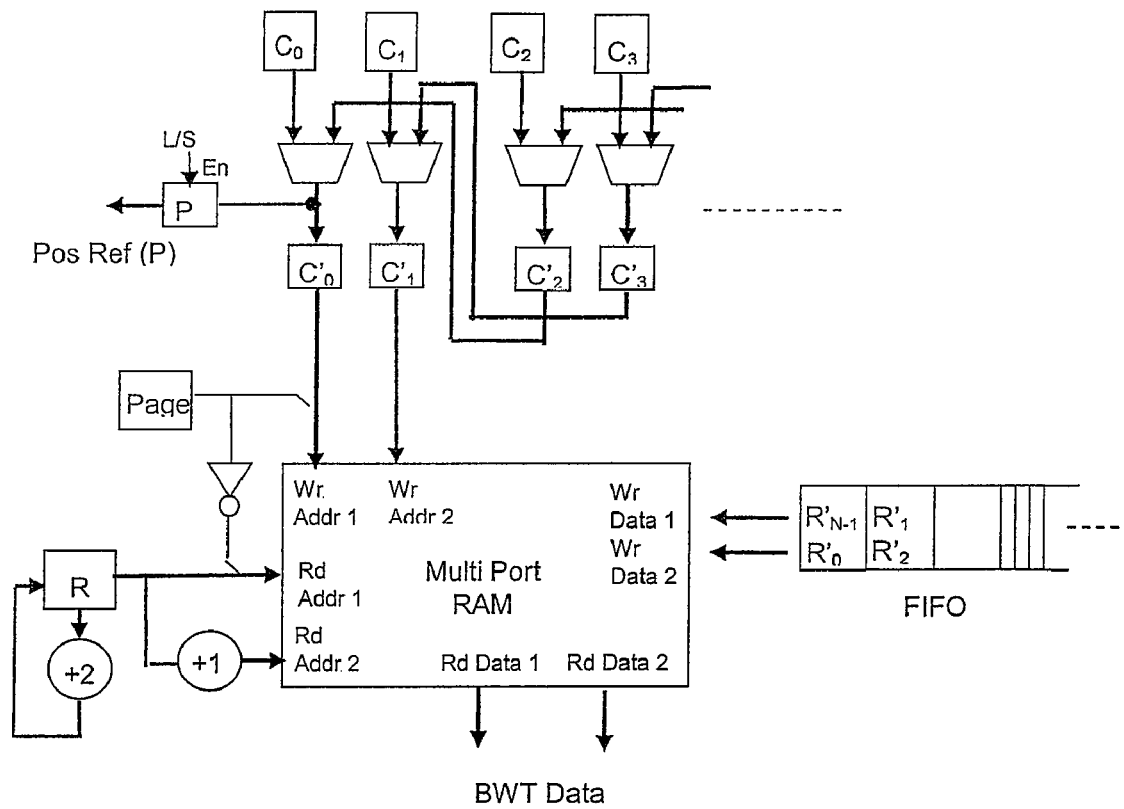

Two sets of logic are required to combine the results, from the two sets of comparison logic (as two rotations of N are now carried out in one cycle). The counters are also modified to allow them to increment by up to 2 if required (i.e. both $I_n$ and $i_n$). The output stage is also modified to process two counter outputs in each clock cycle as shown in FIG. 13.

For the inverse transform, a similar doubling of logic circuits is required.

This can be extended similarly to process more than two bytes (or other characters) per cycle.

Figure 14:
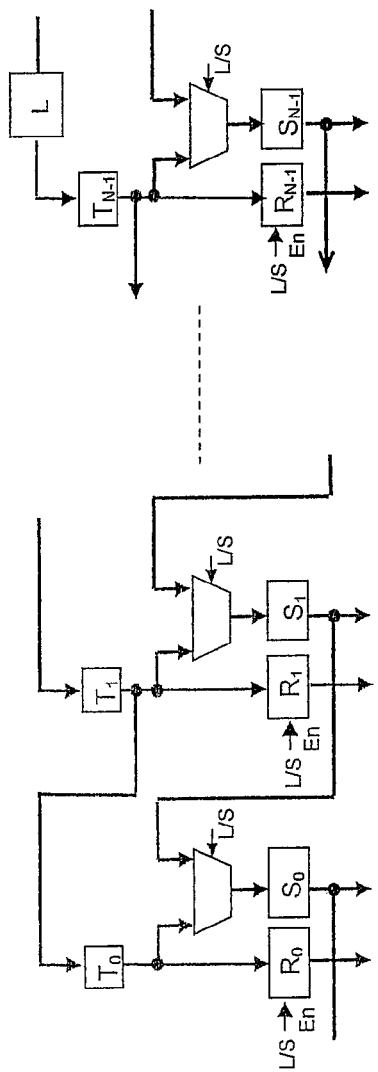
FIGS. 14 and 15 show schematically a portion of variants of the apparatus for the BWT and IBWT respectively that allow for alternative orderings of the data elements.
Figure 15:
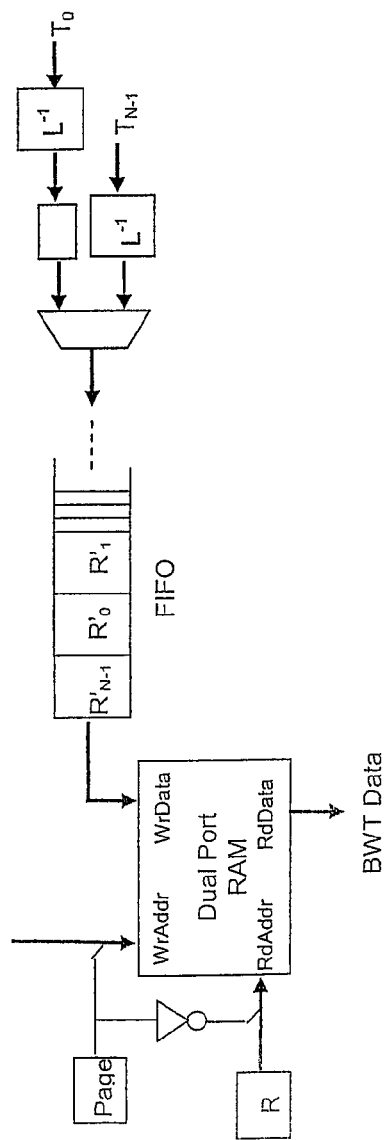

When comparing one character (or N-byte word) with another, the BWT typically adopts normal number ordering, i.e. the convention that 255 is greater than 254, is greater than 253 and so on. However, some variations of the BWT may adopt a different number ordering convention in an attempt to improve the ultimate data compression ratio. To allow for alternative orderings in embodiments of the present invention, a look-up table (which may be constructed from a simple memory) is used to modify the input characters (bytes) such that, for example, each value in the range 0-255 maps to another value in the range 0-255. This is shown schematically in FIG. 14. The LUT table L modifies the incoming characters such that the preferred order maps to the normal ordering during the comparison stages. This allows the comparison functions "=" and ">" to remain unchanged (and as standard arithmetic functions). As shown in FIG. 15, an inverse mapping in a look-up table $L^{-1}$ (which again may be constructed from a simple memory) is used to return the data to its original form prior to writing the data to the RAM.

The apparatus described above, whether for the transform or the inverse transform or both, is preferably implemented as a single silicon device, such as an ASIC (application-specific integrated circuit), such as a standard cell, gate array, full custom circuit or structured circuit, or as an FPGA (Field Programmable Gate Array). Nevertheless, it is possible to, implement the apparatus in a (small) number of discrete devices.

In the description above, many of the various memory elements in the apparatus for transform and inverse transform were described as being implemented by registers (which, as noted above, may be flip flops or edge-triggered d-type flip-flops in particular). However, in the case of each type of apparatus, other types of memory elements may be used for storage of the data. For example, one or more of the sets of reference registers R, shift registers S and counter registers C may be replaced by RAMs to hold the reference, shift and count values. An advantage of using RAMs is that fewer transistors are required than when using registers.

The basic structure is almost the same as for registers. The RAMs are preferably paged to allow one block to be updated while another is processed.

Figure 21:
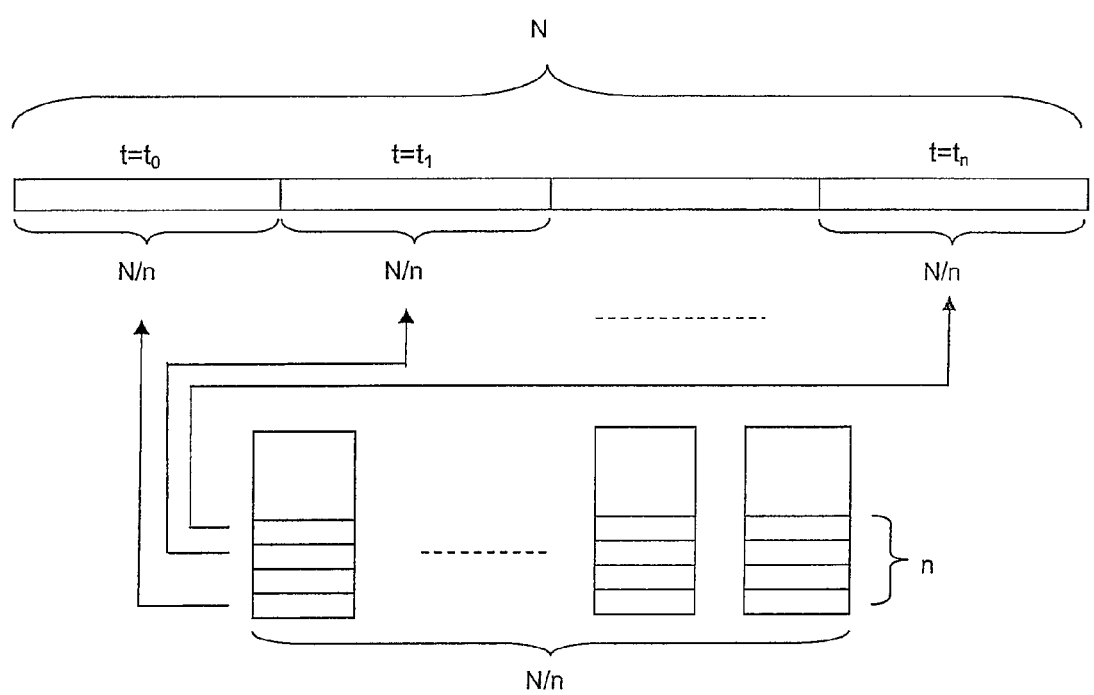

As shown schematically in FIG. 21, when RAMs are used for this purpose, an N-byte block is split into "n" smaller sub-blocks, and each sub-block is stored at a different address within the RAM. The first sub-block is the first N/n bytes of the N bytes, the next is the next N/n bytes and so on. Using RAMs and splitting the N-byte block means performance is reduced as it requires a clock cycle to access each sub block. To build up the whole N bytes requires n clocks i.e. performance is 1/n bytes/clock. However, this can be offset by using the previously described method of doing multiple bytes per cycle such that although it takes n cycles to read all N bytes each sub block of N/n bytes is calculated at a higher bytes/cycle rate. For example, if each RAM supports a width of "m" bytes (i.e. using the method previously described for calculating multiple bytes per cycle when m>1) and a depth of "n" locations, then performance is m/n bytes/cycle.

The counters described above are preferably implemented as binary counters. Nevertheless, other types may be used. For example, non-binary counters may be used to count in a different sequence to the usual ordinal sequence (0, 1, 2, ...). An example is a linear feedback shift register (LFSR), which may use less logic and operate at a faster clock speed than a binary counter. As other alternatives, the counters may be constructed from registers (which again may be flip flops) or RAMs. The important thing here is to provide a consistent numbering system, which can be achieved for example by arranging that the counters that are used also provide the memory read addresses to the output memories.

Embodiments of the present invention have been described with particular reference to the examples illustrated. However, it will be appreciated that variations and modifications may be made to the examples described within the scope of the present invention.

The invention claimed is:

1. Apparatus for transforming a block of data elements such that the order of the data elements is transformed, the apparatus comprising:
    a plurality of first memory elements each for storing a respective one of the data elements in an initial order;
    a plurality of second memory elements each for storing a respective one of the data elements in the initial order, each first memory element corresponding to a respective second memory element;
    a plurality of comparators for comparing the contents of all respective pairs of the first and second memory elements;
    the apparatus being arranged to shift the data elements in the second memory elements to different ones of the second memory elements after each comparison of the contents of the respective pairs of the first and second memory elements whilst maintaining the initial order of the data elements, the comparators being arranged to compare the contents of all respective pairs of the first and second memory elements after each shift, the apparatus being arranged to repeat the shifts and comparisons until every data element has been compared with every other data element; and,
    combiners for combining the outputs of the comparators after each comparison to provide an output that can be used to order the data elements to a final order.

2. Apparatus according to claim 1, wherein the apparatus is arranged such that each comparison of the contents of all respective pairs of the first and second memory elements is carried out in a single clock cycle.

3. Apparatus according to claim 2, wherein the apparatus is arranged such that the data elements in the second memory elements are shifted to different ones of the second memory elements for the next clock cycle.

4. Apparatus according to claim 1, wherein the comparators are arranged to determine if the content of each first memory element is greater than or equal to the content of the corresponding second memory element, the combiners being arranged to combine the outputs of the comparators such that the outputs of the combiners represent whether each of the strings of data elements in the first memory elements that start at the different ones of the first memory elements is greater than or equal to the corresponding strings of data elements in the second memory elements at each comparison.

5. Apparatus according to claim 4, comprising a plurality of counters which are arranged to receive outputs from the respective combiners such that after every data element has been compared with every other data element, the counts stored in the counters represent the order of all logical rotations of the block of data elements.

6. Apparatus according to claim 5, comprising a memory that is arranged to receive the outputs of the counters as write addresses, to receive a copy of the block of data elements shifted by one data element as write data, and to receive an output from an incrementing counter as read addresses, whereby the read data which is output by the memory is the transformed block of data elements.

7. Apparatus according to claim 1, wherein the comparators are arranged to determine if the content of each first memory element is less than or equal to the content of the corresponding second memory element, the combiners being arranged to combine the outputs of the comparators such that the outputs of the combiners represent whether each of the strings of data elements in the first memory elements that start at the different ones of the first memory elements is less than or equal to the corresponding strings of data elements in the second memory elements at each comparison.

8. Apparatus according to claim 7, comprising a plurality of counters which are arranged to receive outputs from the respective combiners such that after every data element has been compared with every other data element, the counts stored in the counters represent the order of all logical rotations of the block of data elements.

9. Apparatus according to claim 8, comprising a memory that is arranged to receive the outputs of the counters as write addresses, to receive a copy of the block of data elements shifted by one data element as write data, and to receive an output from a decrementing counter as read addresses, whereby the read data which is output by the memory is the transformed block of data elements.

10. Apparatus according to claim 5, the apparatus being arranged to store the output of a specified one of the counters as a reference position.

11. Apparatus according to claim 1, comprising a plurality of bias elements that are arranged to provide a different bias at each comparison, the combiners combining the respective biases with the outputs of the comparators at each comparison.

12. Apparatus according to claim 1, wherein the number of first memory elements and the number of second memory elements is each the same prime number, the apparatus being arranged to determine if all data elements in the block are the same.

13. Apparatus according to claim 1, wherein the combiners are arranged in successive stages such that the outputs of the comparators are passed to the inputs of respective pairs of the combiners of the first stage and the outputs of the combiners of one stage are passed to the inputs of respective pairs of combiners of the next stage until the final stage, the outputs of the combiners of the final stage providing the output that can be used to order the data elements to a final order.

14. Apparatus according to claim 1, wherein the first memory elements and the second memory elements are registers.

15. Apparatus according to claim 1, wherein the first memory elements and the second memory elements are RAMs.

16. Apparatus according to claim 1, wherein the comparators are arranged to determine if the content of each first memory element is greater than or equal to the content of the corresponding second memory element, the combiners being arranged to combine the outputs of the comparators such that the outputs of the combiners represent whether the first data element of each of the strings of data elements in the first memory elements that start at the different ones of the first memory elements is greater than or equal to the first data element of the corresponding strings of data elements in the second memory elements at each comparison.

17. Apparatus according to claim 16, comprising:
a plurality of counters which are arranged to receive outputs from the respective combiners;
an incrementing counter;
a selector; and,
a memory that is arranged to receive the outputs of the counters as write addresses, to receive a copy of the block of data elements as first write data, to receive an output from the incrementing counter as second write data which is used by the memory to provide first read data, the selector being arranged to provide initially reference position data and subsequently the first read data as read addresses to the memory, whereby second read data which is output by the memory is the transformed block of data elements.

18. Apparatus according to claim 1, wherein the comparators are arranged to determine if the content of each first memory element is less than or equal to the content of the corresponding second memory element, the combiners being arranged to combine the outputs of the comparators such that the outputs of the combiners represent whether the first data element of each of the strings of data elements in the first memory elements that start at the different ones of the first memory elements is less than or equal to the first data element of the corresponding strings of data elements in the second memory elements at each comparison.

19. Apparatus according to claim 18, comprising:
a plurality of counters which are arranged to receive outputs from the respective combiners;
a decrementing counter;
a selector; and,
a memory that is arranged to receive the outputs of the counters as write addresses, to receive a copy of the block of data elements as first write data, to receive an output from the decrementing counter as second write data which is used by the memory to provide first read data, the selector being arranged to provide initially reference position data and subsequently the first read data as read addresses to the memory, whereby second read data which is output by the memory is the transformed block of data elements.

20. Apparatus according to claim 16, comprising a plurality of bias elements that are arranged to provide a different bias at each comparison, the combiners combining the respective biases with the outputs of the comparators at each comparison.

21. Apparatus according to claim 16, wherein the first memory elements and the second memory elements are registers.

22. Apparatus according to claim 16, wherein the first memory elements and the second memory elements are RAMs.

23. A method of transforming a block of data elements such that the order of the data elements is transformed, the method comprising:
storing the data elements in an initial order in respective ones of a plurality of first memory elements;
storing the data elements in the initial order in respective ones of a plurality of second memory elements, each first memory element corresponding to a respective second memory element;
comparing the contents of all respective pairs of the first and second memory elements;
shifting the data elements in the second memory elements to different ones of the second memory elements after each comparison of the contents of the respective pairs of the first and second memory elements whilst maintaining the initial order of the data elements;
repeating the shifts and comparisons until every data element has been compared with every other data element; and,
combining the results of the comparisons after each comparison to provide a result that can be used to order the data elements to a final order.

24. A method according to claim 23, wherein each comparison of the contents of all respective pairs of the first and second memory elements is carried out in a single clock cycle.

25. A method according to claim 24, wherein the data elements in the second memory elements are shifted to different ones of the second memory elements for the next clock cycle.

26. A method according to claim 23, wherein the comparisons determine if the content of each first memory element is greater than or equal to the content of the corresponding second memory element, the combining steps combining the results of the comparisons such that the results of the combining steps represent whether each of the strings of data elements in the first memory elements that start at the different ones of the first memory elements is greater than or equal to the corresponding strings of data elements in the second memory elements at each comparison.

27. A method according to claim 26, comprising passing the results of the combining steps to respective counters such that after every data element has been compared with every other data element, the counts stored in the counters represent the order of all logical rotations of the block of data elements.

28. A method according to claim 27, comprising passing the outputs of the counters as a write address to a memory, passing a copy of the block of data elements shifted by one data element as write data to said memory, and to pass an output from an incrementing counter as a read address to said memory, whereby the read data which is output by said memory is the transformed block of data elements.

29. A method according to claim 23, wherein the comparisons determine if the content of each first memory element is less than or equal to the content of the corresponding second memory element, the combining steps combining the results of the comparisons such that the results of the combining steps represent whether each of the strings of data elements in the first memory elements that start at the different ones of the first memory elements is less than or equal to the corresponding strings of data elements in the second memory elements at each comparison.

30. A method according to claim 29, comprising passing the results of the combining steps to respective counters such that after every data element has been compared with every other data element, the counts stored in the counters represent the order of all logical rotations of the block of data elements.

31. A method according to claim 30, comprising passing the outputs of the counters as a write address to a memory, passing a copy of the block of data elements shifted by one data element as write data to said memory, and to pass an output from a decrementing counter as a read address to said memory, whereby the read data which is output by said memory is the transformed block of data elements.

32. A method according to claim 27, comprising storing the output of a specified one of the counters as a reference position.

33. A method according to claim 23, comprising providing a different bias at each comparison, wherein the combining steps combine the respective biases with the results of the comparisons at each comparison.

34. A method according to claim 23, wherein the number of first memory elements and the number of second memory elements is each the same prime number, and comprising determining if all data elements in the block are the same.

35. A method according to claim 23, wherein the comparisons determine if the content of each first memory element is greater than or equal to the content of the corresponding second memory element, the combining steps combining the results of the comparisons such that the results of the combining steps represent whether the first data element of each of the strings of data elements in the first memory elements that start at the different ones of the first memory elements is greater than or equal to the first data element of the corresponding strings of data elements in the second memory elements at each comparison.

36. A method according to claim 35, comprising passing the results of the combining steps to respective counters, passing the outputs of the counters to a memory as write addresses, passing a copy of the block of data elements to said memory as first write data, passing an output from an incrementing counter to said memory as second write data which is used by the memory to provide first read data, and operating a selector to provide initially reference position data and subsequently the first read data as read addresses to said memory, whereby second read data which is output by the memory is the transformed block of data elements.

37. A method according to claim 23, wherein the comparisons determine if the content of each first memory element is less than or equal to the content of the corresponding second memory element, the combining steps combining the results of the comparisons such that the results of the combining steps represent whether the first data element of each of the strings of data elements in the first memory elements that start at the different ones of the first memory elements is less than or equal to first data element of the corresponding strings of data elements in the second memory elements at each comparison.

38. A method according to claim 37, comprising passing the results of the combining steps to respective counters, passing the outputs of the counters to a memory as write addresses, passing a copy of the block of data elements to said memory as first write data, passing an output from a decrementing counter to said memory as second write data which is used by the memory to provide first read data, and operating a selector to provide initially reference position data and subsequently the first read data as read addresses to said memory, whereby second read data which is output by the memory is the transformed block of data elements.

39. A method according to claim 35, comprising providing a different bias at each comparison, wherein the combining steps combine the respective biases with the results of the comparisons at each comparison.

40. A method according to claim 23, wherein the first memory elements and the second memory elements are registers.

41. A method according to claim 23, wherein the first memory elements and the second memory elements are RAMs.

42. A method according to claim 23, wherein the data elements are each a single byte.

43. A method according to claim 23, wherein the data elements are each a fixed number of plural bytes.

* * * * *